US010416253B2

(12) United States Patent
Martien et al.

(10) Patent No.: US 10,416,253 B2
(45) Date of Patent: Sep. 17, 2019

(54) CONICAL ACCESS SPLIT MAGNET SYSTEM

(71) Applicant: Quantum Design International, Inc., San Diego, CA (US)

(72) Inventors: Dinesh Martien, San Diego, CA (US); William Neils, San Diego, CA (US); Randall Black, San Diego, CA (US)

(73) Assignee: QUANTUM DESIGN INTERNATIONAL, INC., San Diego, CA (US)

( * ) Notice: Subject to any disclaimer, the term of this patent is extended or adjusted under 35 U.S.C. 154(b) by 361 days.

(21) Appl. No.: 15/358,530

(22) Filed: Nov. 22, 2016

(65) Prior Publication Data
US 2018/0143273 A1    May 24, 2018

(51) Int. Cl.
G01R 33/38     (2006.01)
G01R 33/3815   (2006.01)
H01F 6/04      (2006.01)

(52) U.S. Cl.
CPC ..... *G01R 33/3804* (2013.01); *G01R 33/3806* (2013.01); *G01R 33/3815* (2013.01); *H01F 6/04* (2013.01)

(58) Field of Classification Search
CPC ................ G01R 33/3804; G01R 33/3806
See application file for complete search history.

(56) References Cited

U.S. PATENT DOCUMENTS

| 4,478,711 A | 10/1984 | Cohen et al. |
| 4,609,109 A | 9/1986 | Good |
| 4,784,760 A | 11/1988 | Good et al. |
| 5,799,653 A | 9/1998 | Carlson |
| 6,570,475 B1 | 5/2003 | Lvovsky et al. |
| 6,707,363 B1 | 3/2004 | Abele |

(Continued)

FOREIGN PATENT DOCUMENTS

| WO | WO0196020 | 12/2001 |
| WO | WO2009147392 | 12/2009 |

OTHER PUBLICATIONS

Cryongenic Limited. "Ultra-Large Aperture 5.5 T Split-Coil Magnet for Spectroscopy in the THz Spectral Range." 1 page.

*Primary Examiner* — Patrick Assouad
*Assistant Examiner* — Haidong Zhang
(74) *Attorney, Agent, or Firm* — Stetina Brunda Garred and Brucker; Mark B. Garred

(57) ABSTRACT

A cryostat apparatus including a cooler configured to cool a cryogenic fluid. The cooler includes a cooler chamber disposed about a cooler axis. A magnet assembly is in thermodynamic communication with the cooler and is disposed about a magnet axis offset from the cooler axis. The magnet assembly includes a magnet housing and first and second annular magnet coils disposed about the magnet axis within the magnet housing. A viewing chamber is at least partially located between the first and second magnet coils, such that the magnet axis and a viewing axis perpendicular to the magnet axis both pass through the viewing chamber, with the viewing axis extending between the first and second magnet coils. The first annular magnet coil includes a first conical surface disposed about the magnetic axis and having minimum and maximum peripheries, the minimum periphery being disposed adjacent the viewing chamber.

21 Claims, 11 Drawing Sheets

(56) References Cited

U.S. PATENT DOCUMENTS

| | | |
|---|---|---|
| 6,963,200 B2 | 11/2005 | Abele |
| 7,116,198 B1 | 10/2006 | Abele |
| 7,154,271 B2 | 12/2006 | Kakugawa et al. |
| 7,208,954 B2 | 4/2007 | Aihara et al. |
| 7,212,003 B2 | 5/2007 | Aihara et al. |
| 7,728,707 B2 | 6/2010 | Gilardi et al. |
| 7,928,730 B2 | 4/2011 | Aoki et al. |
| 8,228,148 B2 | 7/2012 | Iwasa et al. |
| 8,255,022 B2 | 8/2012 | Schneider et al. |
| 8,255,023 B2 | 8/2012 | Schlenga et al. |
| 8,525,447 B2 * | 9/2013 | Antaya ............... H05H 13/005 |
| | | 315/502 |
| 8,791,656 B1 * | 7/2014 | Zwart .................. H05H 7/04 |
| | | 315/503 |
| 8,965,468 B2 | 2/2015 | Iwasa |
| 9,081,070 B2 | 7/2015 | Konijn et al. |

* cited by examiner

CONICAL ACCESS SPLIT MAGNET SYSTEM

CROSS-REFERENCE TO RELATED APPLICATIONS

Not Applicable

STATEMENT RE: FEDERALLY SPONSORED RESEARCH/DEVELOPMENT

Not Applicable

BACKGROUND

1. Technical Field

The present disclosure relates generally to magneto-optical property measurement devices and, more particularly, to a superconducting magnet design which is suitable for use in such devices and has a unique shape which presents advantages over existing designs when used in laboratory magnet systems requiring optical access.

2. Description of the Related Art

Superconducting magnets are typically used in laboratory environments where it is desired to expose specimens to fields larger than, for example, about three (3) Tesla. One of the challenges that faces the designer of such a magnet system is to achieve fields that are both high and that have a sufficiently large and accessible working region. These requirements have led to the widespread adoption of two main magnet geometries: (1) the single solenoid, and (2) the split coil.

The single solenoid design normally provides the highest homogeneous field. It is used extensively in applications like NMR spectroscopy where the best magnets have the highest fields with the highest uniformity. However, when access is required through the side of the magnet, a split coil arrangement is typically used as an alternative to the single solenoid design. A split coil magnet is like a solenoid that has been split along its center line so that side access, perpendicular to the field direction, is available. In both cases, the coils themselves are constructed in a rectangular cross-section for ease of manufacturing.

However, though the split coil arrangement provides the advantage of side access perpendicular to the field direction as indicated above, it is still generally deficient when used in applications requiring unimpeded access to the central field region with a large viewing angle, as the rectangular geometry of the coils is limiting.

To address this problem, the present disclosure proposes a coil design which is optimized for both field uniformity in the central region and for external viewing angle along the axes of the magnet.

BRIEF SUMMARY

In accordance with the present disclosure, there is provided a magnet having a modified split coil geometry with at least one tapered surface to increase the viewing angle into a viewing chamber defined by the split coil configuration.

According to one embodiment, there is provided a cryostat apparatus for providing a magnetic field. The apparatus includes a cooler having a cooler chamber disposed about a cooler axis, with the cooler being configured to cool a cryogenic fluid. A magnet assembly is in thermodynamic communication with the cooler and is disposed about a magnet axis offset from the cooler axis. The magnet assembly includes a magnet housing and a first annular magnet coil disposed about the magnet axis within the magnet housing. A second annular magnet coil is disposed within the magnet housing and is spaced from the first magnet coil along the magnet axis. A viewing chamber is at least partially located between the first magnet coil and the second magnet coil, such that the magnet axis and a viewing axis perpendicular to the magnet axis both pass through the viewing chamber, with the viewing axis extending between the first magnet coil and the second magnet coil. The first annular magnet coil includes a first conical surface disposed about the magnetic axis and having a minimum periphery and a maximum periphery spaced from the minimum periphery, the minimum periphery being disposed adjacent the viewing chamber.

The second magnet coil may include a second conical surface disposed about the magnet axis and having a minimum periphery and a maximum periphery spaced from the minimum periphery, with the minimum periphery being disposed adjacent the viewing chamber. The first conical surface and the second conical surface may be symmetrical about an axis perpendicular to the magnet axis.

The magnet housing may include a first viewing window positioned relative to the first and second magnet coils such that the first viewing window defines a first viewing axis therethrough which is substantially perpendicular to the magnet axis. The magnet housing may further include a second viewing window positioned relative to the first and second magnet coils such that the second viewing window defines a second viewing axis therethrough which is substantially parallel to the magnet axis. The magnet housing may include an outer wall extending generally perpendicularly relative to the magnet axis, with the first conical surface extending between the outer wall to the second viewing window and defining a frusto-conical recess having a minimum periphery adjacent the second viewing window and a maximum periphery adjacent the outer wall.

The magnet assembly may further include a first thermal shield surrounding the first magnet coil and a second thermal shield surrounding the second magnet coil.

The cryostat apparatus may further comprise a heat transfer plate extending between the magnet assembly and the cooler, with the heat transfer plate being in thermodynamic communication with the magnet assembly and the cooler.

The cooler may be a cryogenic cooler having at least one reduced-temperature stage.

According to another implementation, there is provided a magnetic cryostat apparatus comprising a cooler extending along a cooler axis, and a first magnet coil disposed about a magnet axis offset from the cooler axis. The first magnet coil includes a tapered annular surface having a minimum periphery and a maximum periphery spaced from the minimum periphery. A second magnet coil is spaced from the first magnet coil and is disposed about the magnet axis. A viewing chamber is at least partially located between the first magnet coil and the second magnet coil and adjacent the minimum periphery of the first magnet coil. The magnet axis and a viewing axis perpendicular to the magnet axis both pass through the viewing chamber, with the viewing axis extending between the first magnet coil and the second magnet coil.

According to another embodiment, there is provided a cryostat apparatus for providing a magnetic field with enhanced optical access. The cryostat apparatus includes a split-coil superconducting magnet comprising two coils disposed about a magnetic axis and a center field region disposed between the two coils, with at least one of the two coils having an inward facing cone shape. A split region is located between the two coils and provides line of sight access between the center field region and a region radially outside of the split-coil superconducting magnet. A vacuum housing is located around the split-coil superconducting magnet. At least one optically transparent window in the vacuum housing allows line of sight access along the magnet axis, with the region of the vacuum housing surrounding the transparent window being an inward facing cone shape. At least one optically transparent window in the vacuum housing allows line of sight access radially between said center field region and a region outside the cryostat through the split in the magnet. The cryostat apparatus additionally includes a cooler extending along a cooler axis offset from the magnet axis.

The present disclosure is best understood by reference to the following detailed description when read in conjunction with the accompanying drawings.

BRIEF DESCRIPTION OF THE DRAWINGS

These, as well as other features of the present disclosure, will become more apparent upon reference to the drawings wherein.

Common reference numerals are used throughout the drawings and detailed description to indicate like elements.

DETAILED DESCRIPTION

Figure 1:
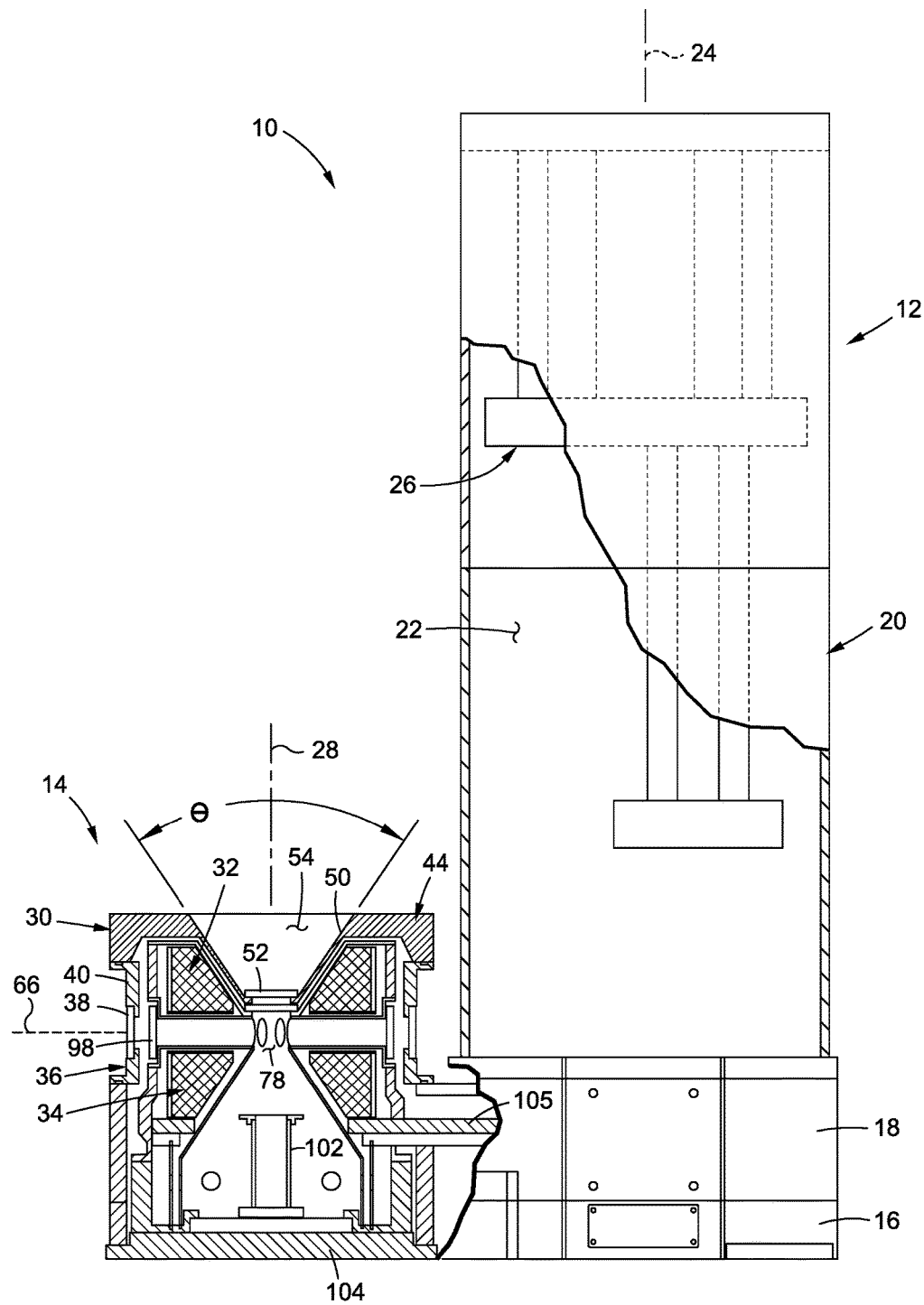
FIG. 1 is a front, partial, cross-sectional view of a cryostat apparatus according to one embodiment of the present disclosure.
Figure 2:
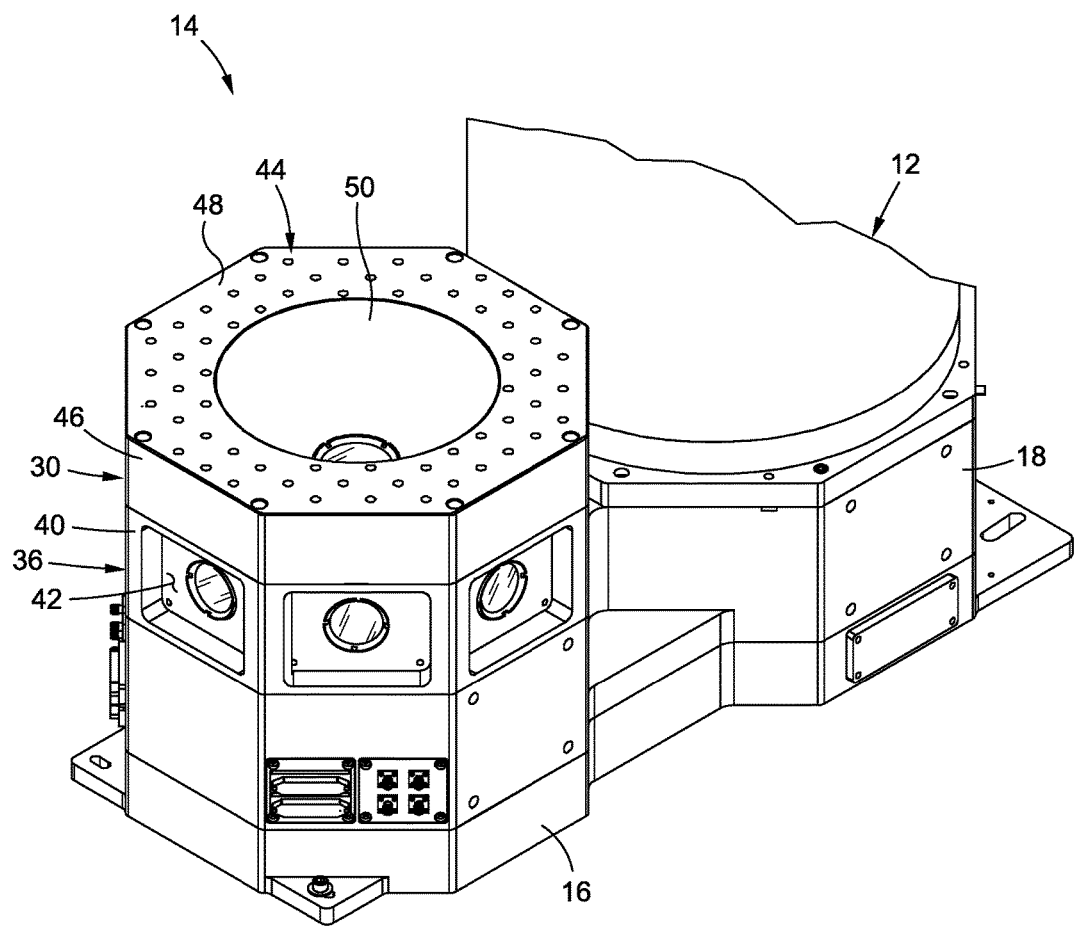
FIG. 2 is an upper perspective view of the magnet assembly portion of the cryostat apparatus shown in FIG. 1.

Referring now to the drawings for which the showings are for purposes of illustrating a preferred embodiment of the present disclosure only, and not for purposes of limiting the same, FIG. 1 depicts a cryostat apparatus 10 for providing a magnetic field. As will be explained in more detail below, the cryostat apparatus 10 includes a uniquely configured split coil magnet configuration, wherein each coil has a tapered surface to enhance the viewing angle in at least one viewing direction.

According to one embodiment, the cryostat apparatus 10 generally includes a cooler 12 and a magnet assembly 14 residing next to the cooler 12, with the cooler 12 being configured to provide cooling power to the magnet assembly 14. The cooler 12 and the magnet assembly 14 may be physically connected to each other at respective lower regions of both the cooler 12 and the magnet assembly 14. Along these lines, in the exemplary embodiment, the cryostat apparatus 10 includes a base 16, and a lower peripheral wall 18 positioned on top of the base 16. The base 16 and lower peripheral wall 18 are shared by and thus define portions of both the cooler 12 and the magnet assembly 14. One particular implementation of the base 16 is specifically configured and adapted to be coupled to an optical bench to facilitate examination of specimens or samples located within the magnet assembly 14. The base 16 and lower peripheral wall 18, when operatively coupled to each other, collectively define respective ones of a spaced pair of interconnected, multi-faceted exterior wall regions, each of which is preferably an octagonal region defining eight (8) exterior wall regions. In this regard, the cooler 12 is associated with one octagonal region, with the magnet assembly 14 being associated with the separate, remaining octagonal region. It is understood that while the exemplary embodiment includes octagonal regions, other multi-sided regions may be included without departing from the spirit and scope of the present disclosure, such as triangular, quadrangular, pentagonal, hexagonal, heptagonal, or other polygonal shapes known in the art. It is also contemplated that instead of having an octagonal or multi-sided region, the magnet assembly 14 may have a rounded, circular or oval configuration.

The cooler 12 generally includes a cooler housing 20, at least partially formed by the base 16 and the lower peripheral wall 18, with the cooler housing 20 defining a cooler chamber disposed about a cooler axis 24. The cooler 12 additionally includes a coldhead 26 coupled to the cooler housing 20 and extending into the cooler chamber 22 along the cooler axis 24. The coldhead 26 is adapted to cool a cryogenic fluid for purposes of cooling the split coil magnet located within the magnet assembly 14. The coldhead 26 is a known component in the art, examples including a pulsetube cryocooler and a Gifford-McMahon (GM) two-stage closed cycle refrigerator. The cooler 12 may include an inlet (not shown) connectable to a source of cryogenic fluid to introduce a cryogenic fluid, such as helium, into the cooler 12. The cooler 12 may be configured to maintain the cryogenic fluid at approximately 0.5-2.0 atmospheres of pressure. Various aspects of the disclosure relate to the offset position of the split coil magnet relative to the cooler axis 24, as will be described below.

Though more detailed structural and functional features of the cooler 12 are not provided herein, it will be understood that an exemplary configuration for the cooler 12 is described with particularity in Applicant's U.S. Pat. No. 9,234,691, the disclosures of which is incorporated herein by reference.

The magnet assembly 14 is in thermodynamic communication with the cooler 12 and is disposed about a magnet axis 28 offset from the cooler axis 24. In this regard, the magnet axis 28 is not co-linear with the cooler axis 24. Rather, the magnet axis 28 is spaced from the cooler axis 24 in a direction generally perpendicular to the cooler axis 24. This allows the magnet assembly 14 and the cooler 12 to assume a side-by-side configuration or arrangement, rather than the magnet assembly 14 being on top of the cooler 12, or below the cooler 12. In the exemplary embodiment, the magnet axis 28 is generally parallel to the cooler axis 24, although it is understood that the magnet axis 28 may be non-parallel to the cooler axis 24 without departing from the spirit and scope of the present disclosure. The side-by-side configuration allows for line of sight access into the magnet assembly 14 along the magnet axis 28 without the cooler 12 obstructing the view. Furthermore, the offset configuration also mitigates the transfer of vibrations from the cooler 12 to the magnet assembly 14, thereby provide a physically stable environment for a sample located within the magnet assembly 14.

The magnet assembly 14 generally includes a magnet housing 30, a first annular magnet coil 32, and a second annular magnet coil 34, with the magnet coils 32, 34 collectively defining the magnet axis 28. The magnet housing 30 is partially defined by the base 16 and the lower peripheral wall 18. A window assembly 36 is located on top of the lower peripheral wall 18 and includes a plurality of outer windows 38 positioned about the window assembly 36. In the exemplary embodiment, the window assembly 36 includes seven outer windows 38, with each outer window 38 being located on a respective face or side of the corresponding octagonal region. The side or face of the octagonal region of the magnet assembly 14 which faces the cooler 12 does not include an outer window 38, since the cooler 12 would block the line of sight through such window 38. The window assembly 36 includes a window support wall 40 for supporting the outer windows 38. The window support wall 40 is complimentary in shape to the lower peripheral wall 18, and thus, has a generally octagonal configuration. Each outer window 38 may be located within a respective opening extending through the window support wall 40. Each opening may, in turn, be located within a respective recess 42 formed in the window support wall 40. In the exemplary embodiment, each opening is circular, and supports a circular outer window 38, while each recess 42 is quadrangular. However, it is understood that the outer windows 38, corresponding openings, and recesses 42 may define other shapes without departing from the spirit and scope of the present disclosure.

Figure 3:
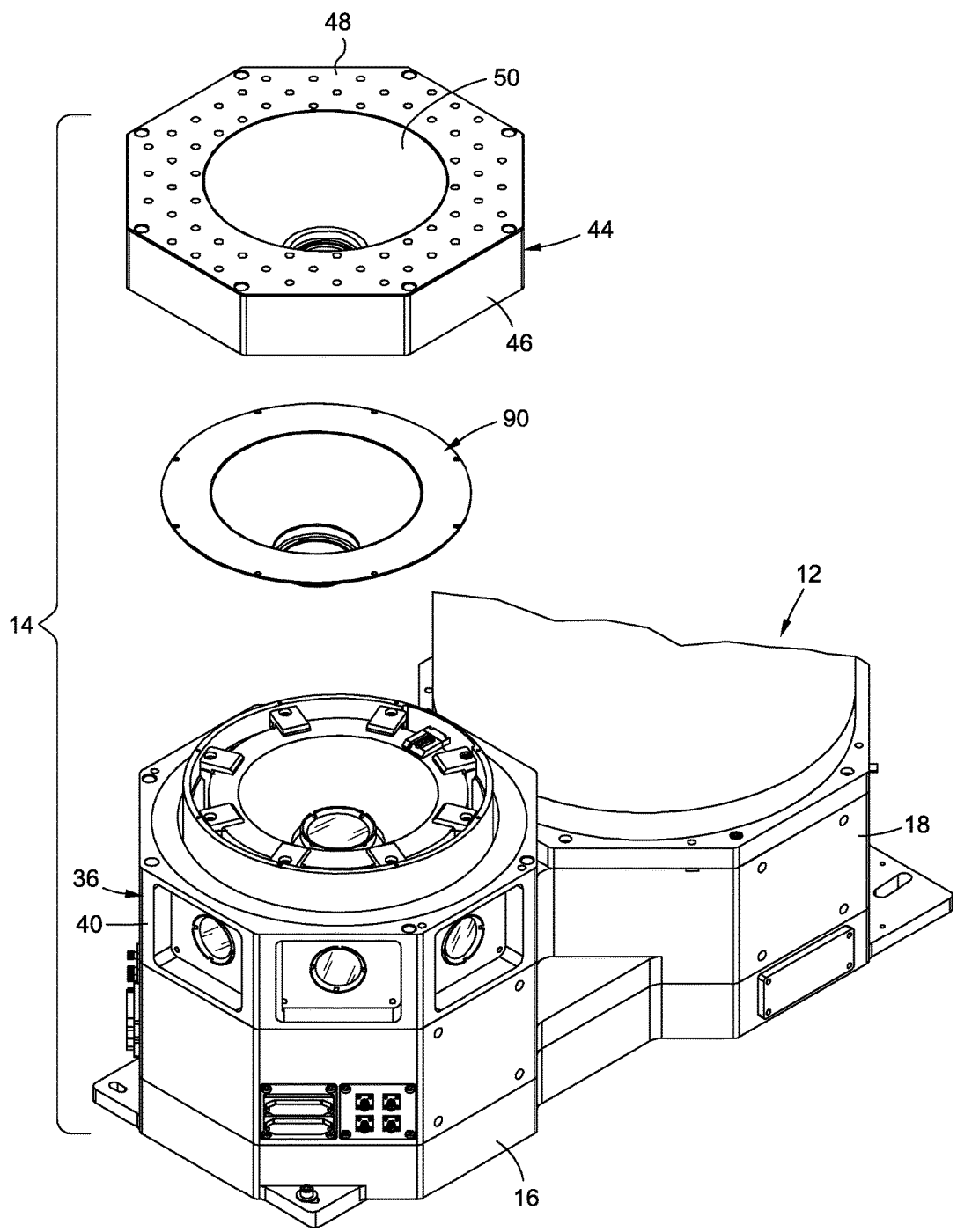
FIG. 3 is a partially exploded, upper perspective view of the magnet assembly shown in FIG. 2.
Figure 4:
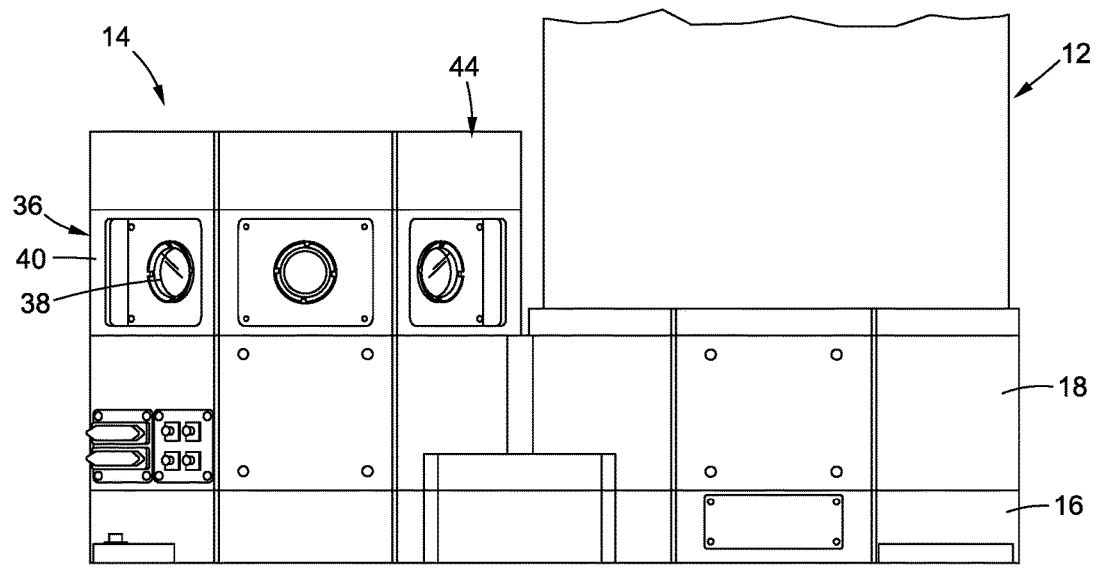
FIG. 4 is a front view of the portion of the cryostat apparatus depicted in FIG. 2.

The magnet housing 30 further includes a lid 44 having a lid peripheral wall 46, a lid top wall 48, and a lid conical wall 50. The lid 44 fits on top of the window assembly 36, with the lid peripheral wall 46 being complimentary in shape to the window support wall 40. FIG. 3 shows the lid 44 removed from the window assembly 36. The lid top wall 48 extends between the lid peripheral wall 46 and the lid conical wall 50. The lid conical wall 50 is disposed about the magnet axis 28 and extends into the magnet assembly 14, with the lid conical wall 50 defining a maximum diameter at the intersection with the lid top wall 48. The lid conical wall 50 extends from the lid top wall 48 and terminates at a lid opening, which defines a minimum diameter of the lid conical wall 50. An outer lid window 52 is coupled to the lid conical wall 50 and is optically aligned with the lid opening to allow viewing into the magnet assembly 14 along the magnet axis 28. The lid conical wall 50 defines a frustoconical space 54 expanding outwardly from the outer lid window 52 to enhance a viewing angle into the magnet assembly 14 relative to the magnet axis 28.

Located inside of the magnet housing 30 are the first and second annular magnet coils 32, 34, which form a split-coil arrangement. According to one embodiment, the coils 32, 34 are wound along a profile that mimics a continuum of Helmholtz coils to produce a highly uniform field at its center where the coil separation is equal to the radius of the coils 32, 34. The first annular magnet coil 32 includes opposing primary and second end surfaces 56, 58 spaced from each other and generally perpendicular to the magnet axis 28. The first annular magnet coil 32 further includes an outer peripheral surface 60, an inner peripheral surface 62, and a first conical surface 64. According to one embodiment, the primary and secondary end surfaces 56, 58 are generally parallel to each other, and the outer and inner peripheral surfaces 60, 62 are coaxially disposed about the magnet axis 28. Although in the exemplary embodiment the primary end surface 56 is perpendicular to the magnet axis 28, it is contemplated that in other embodiments, the primary end surface 56 may be tapered, and thus, be angled relative to the magnet axis 28, which may result in a larger viewing angle in a direction perpendicular to the magnet axis 28. The first conical surface 64 extends between the inner peripheral surface 62 and the secondary end surface 58, with the first conical surface 64 defining a minimum diameter at the intersection with the inner peripheral surface 62, and a maximum diameter at the intersection with the secondary end surface 58. The inner peripheral surface 62 of the first annular magnet coil 32 defines a first coil opening disposed about the magnet axis 28.

Figure 6:
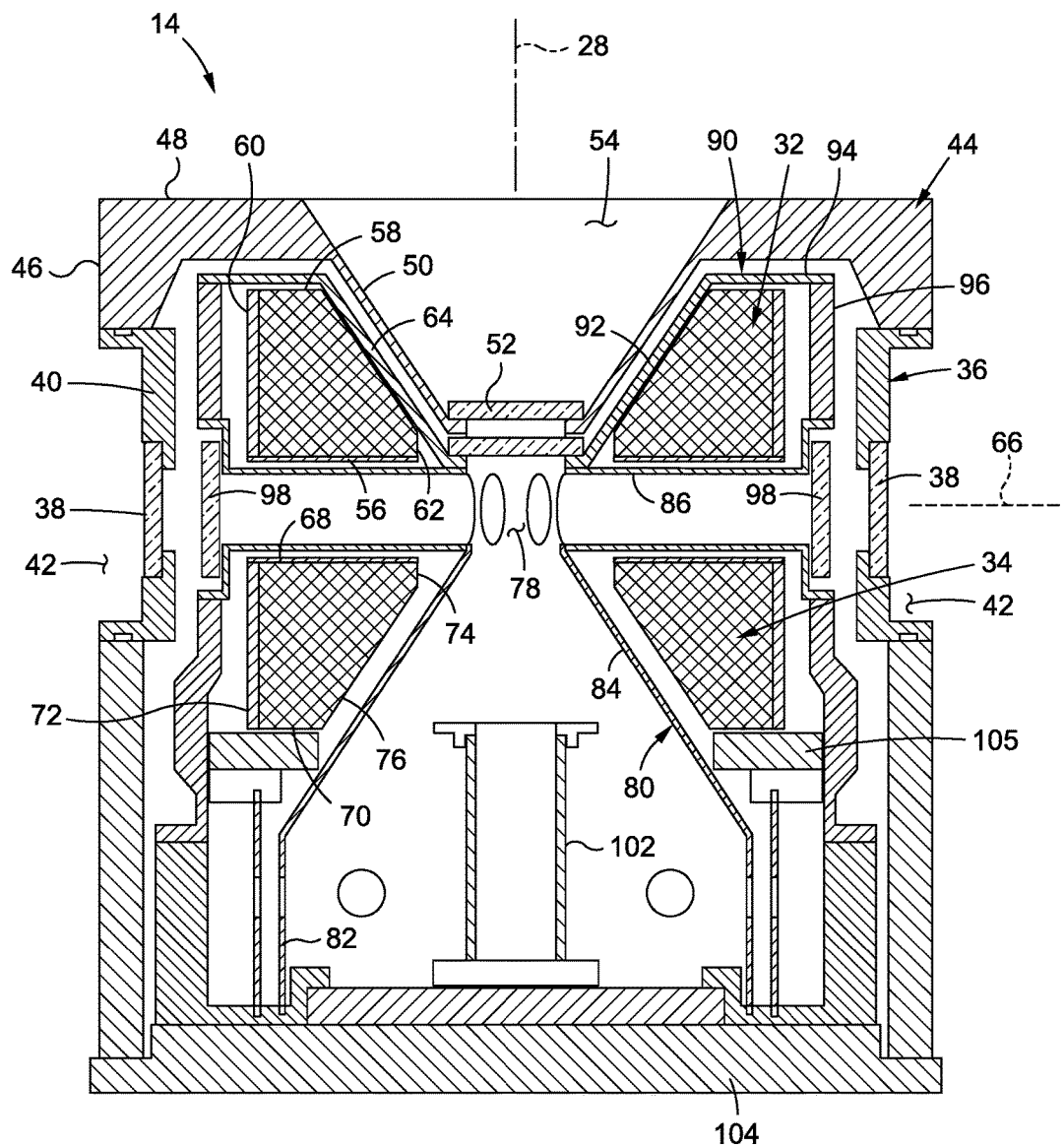
FIG. 6 is a sectional view of the magnet assembly shown in FIG. 2 in a first cross-sectional plane.
Figure 7:
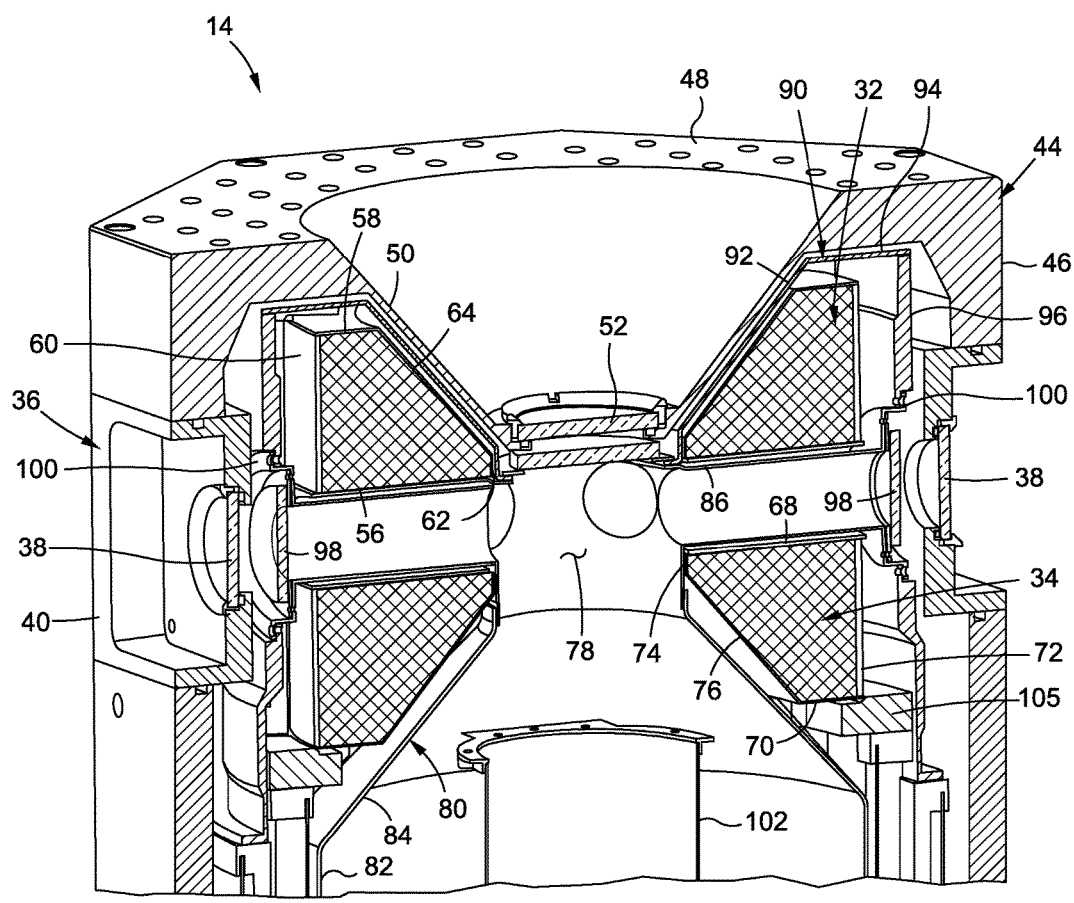
FIG. 7 is an upper perspective, sectional view of the magnet assembly shown in FIG. 2.
Figure 8:
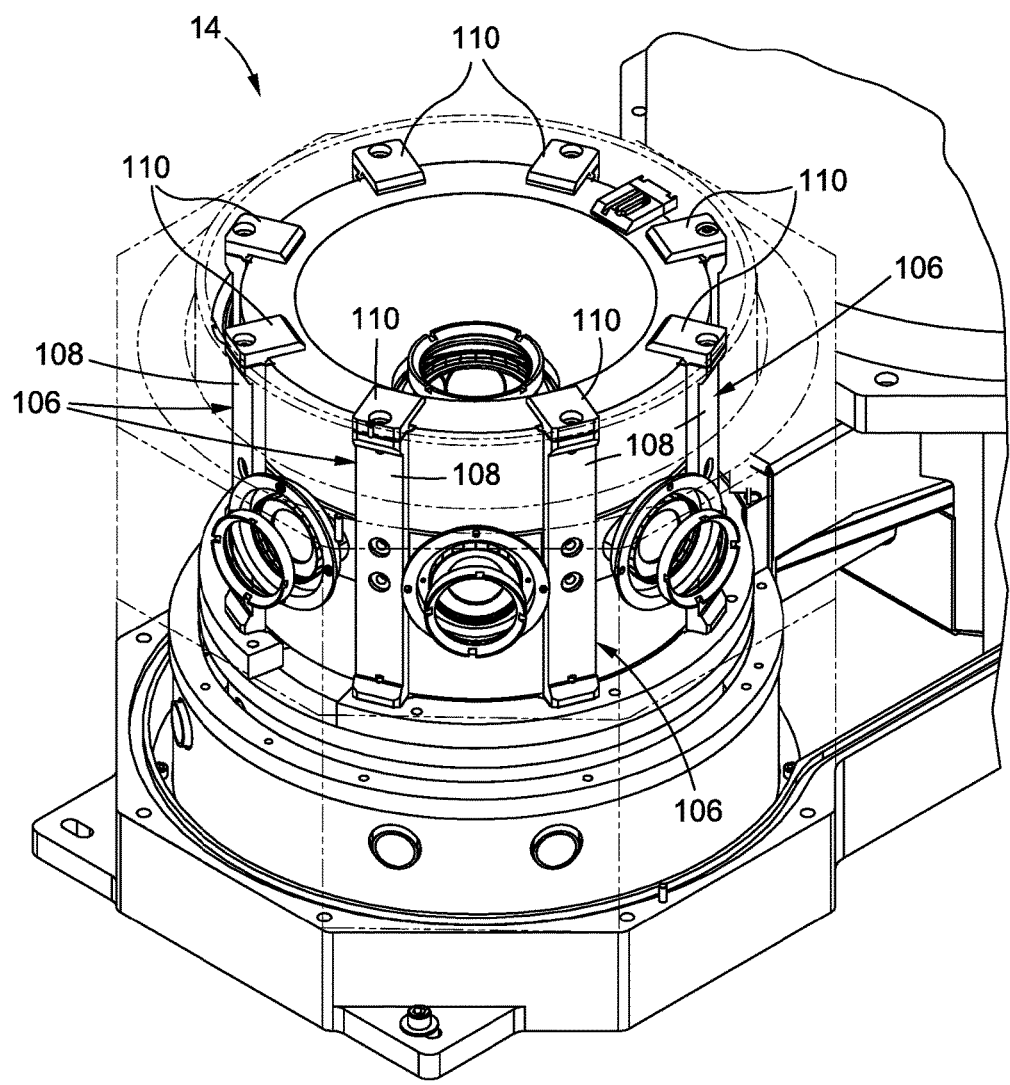
FIG. 8 is an upper perspective view of the magnet assembly shown in FIG. 2, with the magnet housing shown in phantom to illustrate internal components of the magnet assembly.

The second annular magnet coil 34 is a mirror image of the first annular magnet coil 32, with the second annular magnet coil 34 being spaced from the first annular magnet coil 32 along the magnet axis 28 such that a gap is defined therebetween. In FIG. 6, an exemplary axis 66 is depicted which extends through the center of the aforementioned gap in generally perpendicular relation to the magnet axis 28, the first and second annular magnet coils 32, 34 thus being disposed on opposite sides of and equidistantly spaced from the axis 66. In the magnet assembly 14, it is contemplated that the axis 66 may be any one of several, each of which extends axially through at least one window 38, and potentially through a spaced pair of coaxially aligned windows 38, the inclusion of the preferred octagonal region in the magnet assembly 14 resulting in the formation of three (3) pairs of coaxially aligned windows 38. The second annular magnet coil 34 includes a primary end surface 68, an opposing secondary end surface 70, an outer peripheral surface 72, an inner peripheral surface 74, and a second conical surface 76. According to one embodiment, the primary and secondary end surfaces 68, 70 are generally parallel to each other, and the outer and inner peripheral surfaces 72, 74 are coaxially disposed about the magnet axis 28. As noted above in relation to the first annular magnet coil 32, the primary end surface 68 of the second annular magnet coil 34 is shown as being perpendicular to the magnet axis 28, although it is understood that in other embodiments, the primary end surface 68 may be angled relative to the magnet axis 28 to define a tapered configuration for enhancing the viewing angle in a direction perpendicular to the magnet axis 28. The second conical surface 76 extends between the inner peripheral surface 74 and the secondary end surface 70, with the second conical surface 76 defining a minimum diameter at the intersection with the inner peripheral surface 74, and a maximum diameter at the intersection with the secondary end surface 76. The inner peripheral surface 74 of the second annular magnet coil 34 defines a second coil opening disposed about the magnet axis 28.

The first and second annular magnet coils 32, 34 are arranged such that the first and second coil openings are coaxially disposed about the magnet axis 28. Furthermore, the first and second annular magnet coils 32, 34 are spaced from each other to define a viewing chamber 78 therebetween. As shown in FIGS. 1 and 6, the viewing chamber 78 is intersected by the magnet axis 28, as well as the axis 66 that is perpendicular to the magnet axis 28, and which extends between the first and second annular magnet coils 32, 34 as indicated above. In this regard, viewing of a specimen located within the viewing chamber 78 may be achieved along at least two orthogonal axes, e.g., the magnet axis 28 and any axis such as the axis 66 which is perpendicular to the magnet axis 28 and extends through at least one window 38, thereby providing greater visual access to the specimen during testing. Furthermore, the conical configuration of the first annular magnet coil 32 increases the viewing angle θ, relative to the magnetic axis 28, to increase the field of view of the specimen located within the viewing chamber 78.

An advantage of winding the coils 32, 34 in the geometric arrangement described above and shown in the drawings is that the coils 32, 34 produce both good field uniformity as well as an excellent axial viewing angle, particularly when compared to a traditional split coil design.

Figure 5:
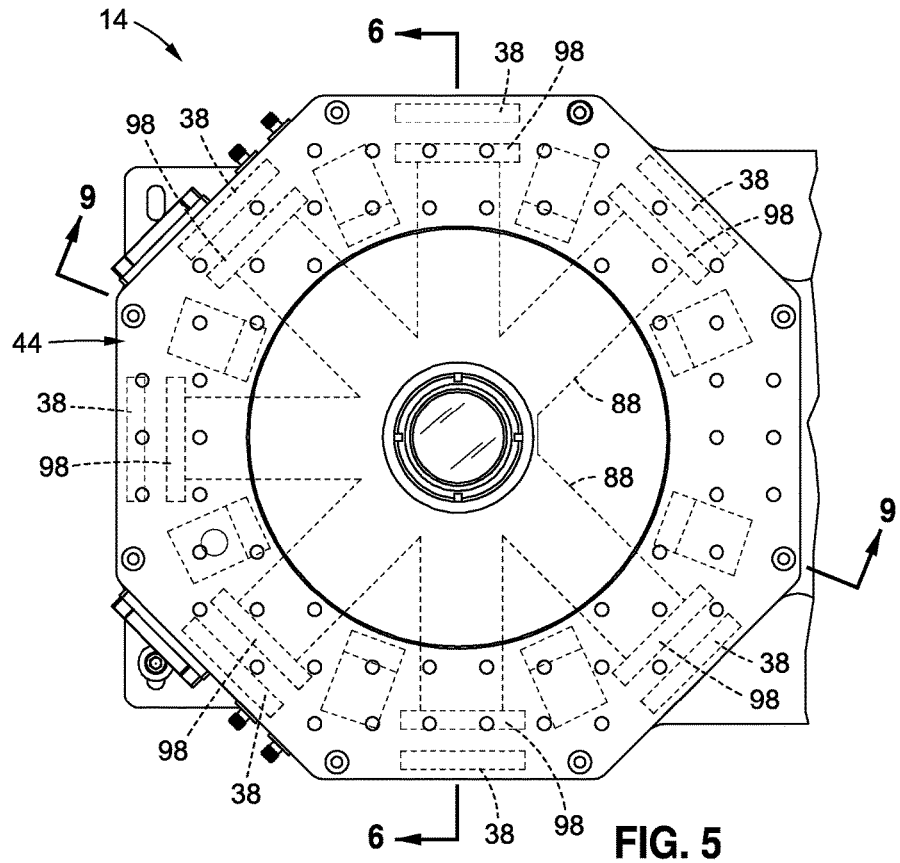
FIG. 5 is a top view of the magnet assembly shown in FIG. 2.

The magnet assembly 14 further includes one or more radiation shields which extend around the first and second annular magnet coils 32, 34. In particular, a lower shield 80 extends upwardly from the base 16, and includes a cylindrical portion 82 and a conical portion 84, which mimics the contour of the second conical surface 76. An intermediate shield 86 is coupled to the lower shield 80 and includes several radial cylindrical portions 88 extending outwardly from the viewing chamber 78. In the exemplary embodiment, the intermediate shield 86 includes seven cylindrical portions 88, as is best depicted in FIG. 5. The number of cylindrical portions 88 corresponds to the number of windows incorporated into the magnet assembly 14, and thus, the number of cylindrical portions 88 may vary without departing from the spirit and scope of the present disclosure. Along these lines, it is contemplated that the aforementioned axis 66 will extend axially through at least one of these cylindrical portions 88, and potentially through a coaxially aligned pair of such cylindrical portions 88. In this regard, the inclusion of the preferred octagonal region in the magnet assembly 14 resulting in the formation of three (3) pairs of coaxially aligned windows 38 in turn results in the formation of three (3) pairs of coaxially aligned cylindrical portions 88. An upper shield 90 is positioned on top of the intermediate shield 86 and includes a conical portion 92 and a planar portion 94, wherein the conical portion 92 mimics the contour of the first conical surface 64. An outer cylindrical shield 96 extends between the upper shield 90 and the lower shield 80. A plurality of openings are formed in the outer cylindrical shield 96, with each opening being sized and configured to receive an inner window 98 and a window collar 100 for connecting the inner window 98 to the outer cylindrical shield 96. The inner windows 98 are aligned with respective ones of the outer windows 38, such that when a user looks into the viewing chamber 78, the user may look through an outer window 38 and a corresponding inner window 98.

Although the foregoing describes the lower shield 80, intermediate shield 86, and upper shield 90 as separate components, it is understood that the shields 80, 86, 90 may operate as a single, integrated unit surrounding the magnet coils 32, 34.

A specimen support 102 and one or more base plates 104 are coupled to the base 16, with the specimen support 102 extending upwardly from the base plates 104 toward the viewing chamber 78. A specimen may be placed on the specimen support 102 during testing thereof. In this regard, the specimen residing on the specimen support 102 may be subjected to magnetic fields generated by the magnet coils 32, 34, while allowing visual inspection and excitation of the specimen along the magnet axis 28, as well as the axis 66 perpendicular to the magnet axis 28.

Operation of the magnet coils 32, 34 requires the coils 32, 34 to be cooled, and thus, the cryostat apparatus 10 includes a heat transfer plate 105 extending between the cooler chamber 22 and the magnet assembly 14. The heat transfer plate 105 includes a first end portion positioned in the cooler 12, and a second end portion positioned within the magnet housing 30, with the first end portion being cooled by virtue of being located within the cooler chamber 22. In particular, as the cryogenic fluid is cooled by the cooler 12, and is in thermal exchange with the heat transfer plate 105, heat flows from the heat transfer plate 105 to the passing fluid, thereby cooling the heat transfer plate 105. Cooling of the first end portion of the heat transfer plate 105 also results in cooling of the second end portion of the heat transfer plate 105 due to the second end portion being integrally formed with the first end portion, and thus, allowing thermodynamic conduction therebetween.

Attached to the second end portion of the heat transfer plate 105 are a plurality of heat transfer brackets 106, which provide a conduction path between the magnet coils 32, 34 and the heat transfer plate 105. According to one embodiment, each heat transfer bracket 106 includes a main body 108 and a pair of opposed flanged end portions 110. The main body 108 extends generally perpendicularly relative to the heat transfer plate 105, while the flanged end portions 110 extend over respective end surfaces of the coils 32, 34.

Figure 9:
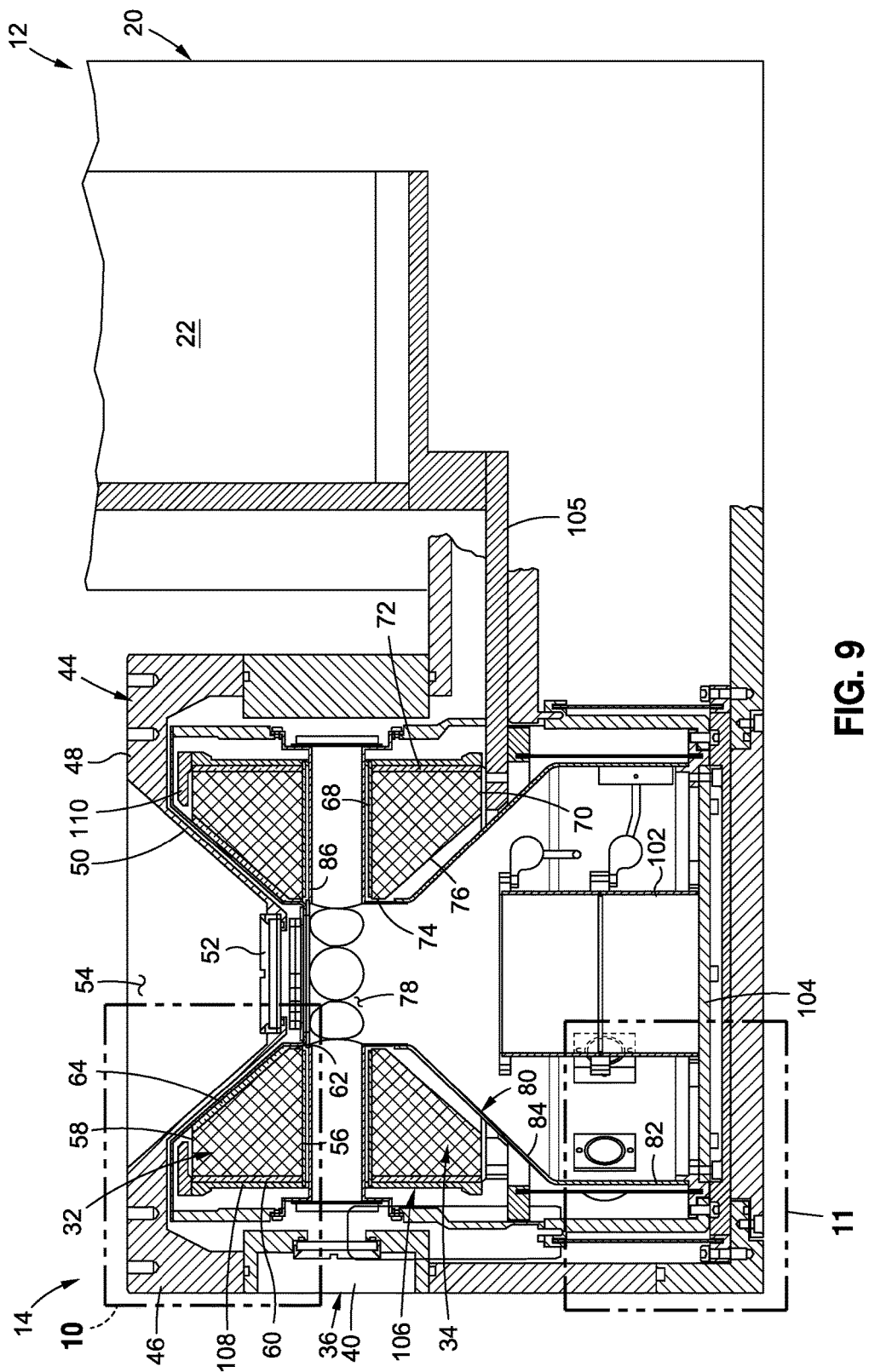
FIG. 9 is a more detailed, sectional view of the magnet assembly shown in FIG. 2 in a second cross sectional plane.
Figure 10:
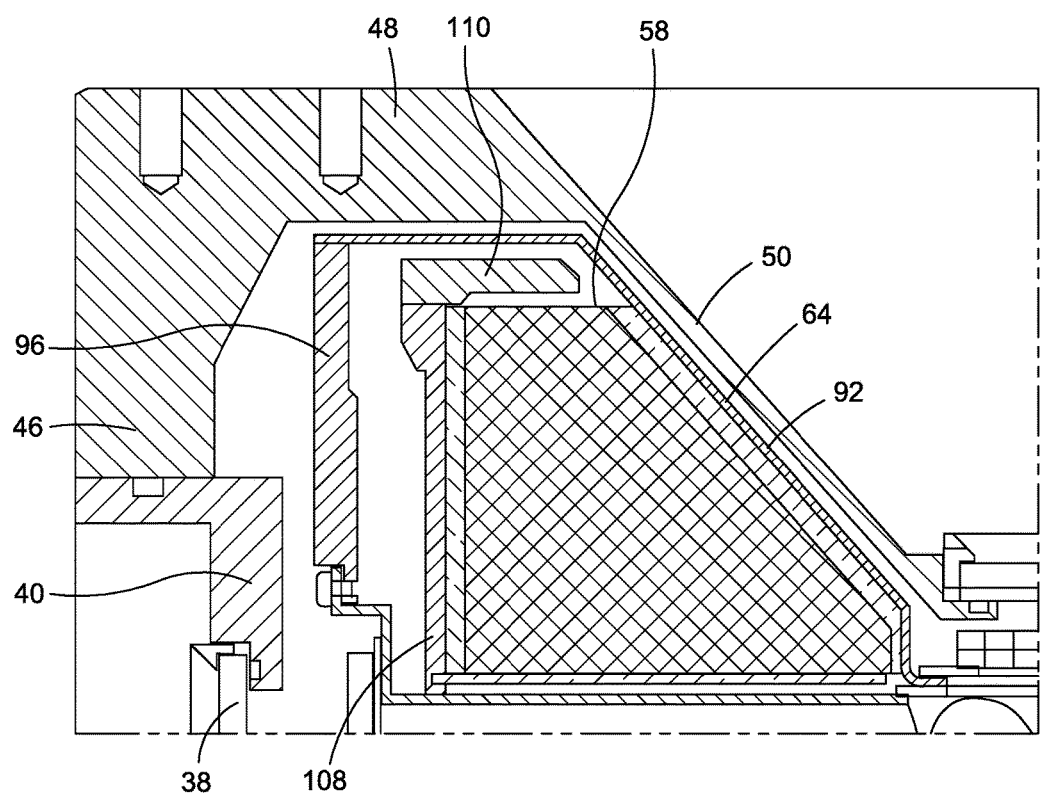
FIG. 10 is an enlarged cross sectional view of a portion of FIG. 9 depicting a distal end portion of a thermally conducting bracket extending around a magnet coil.
Figure 11:
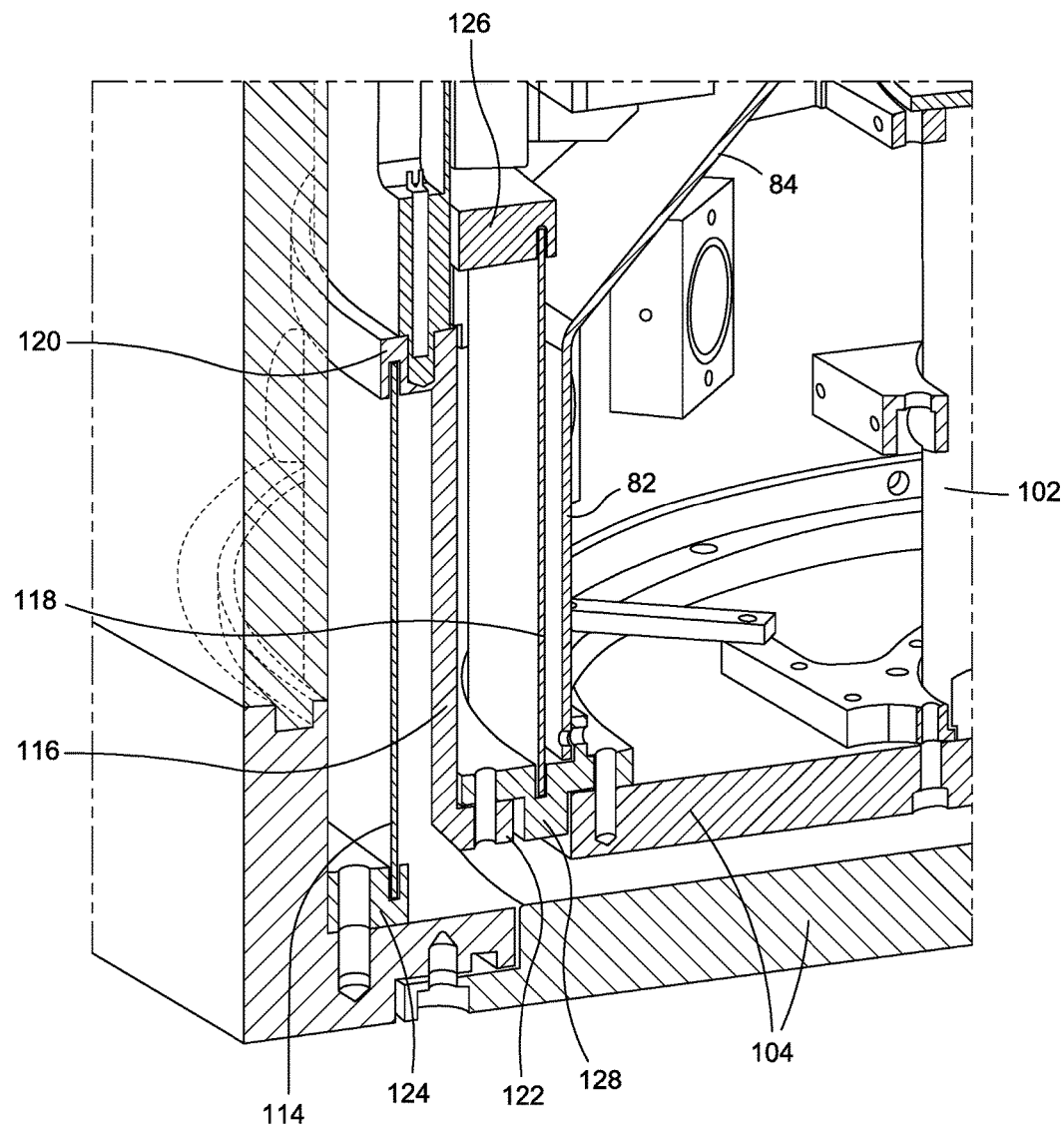
FIG. 11 is an enlarged cross sectional view taken from a first perspective of a lower region of the magnetic housing illustrating an arrangement of concentric support tubes.
Figure 12:
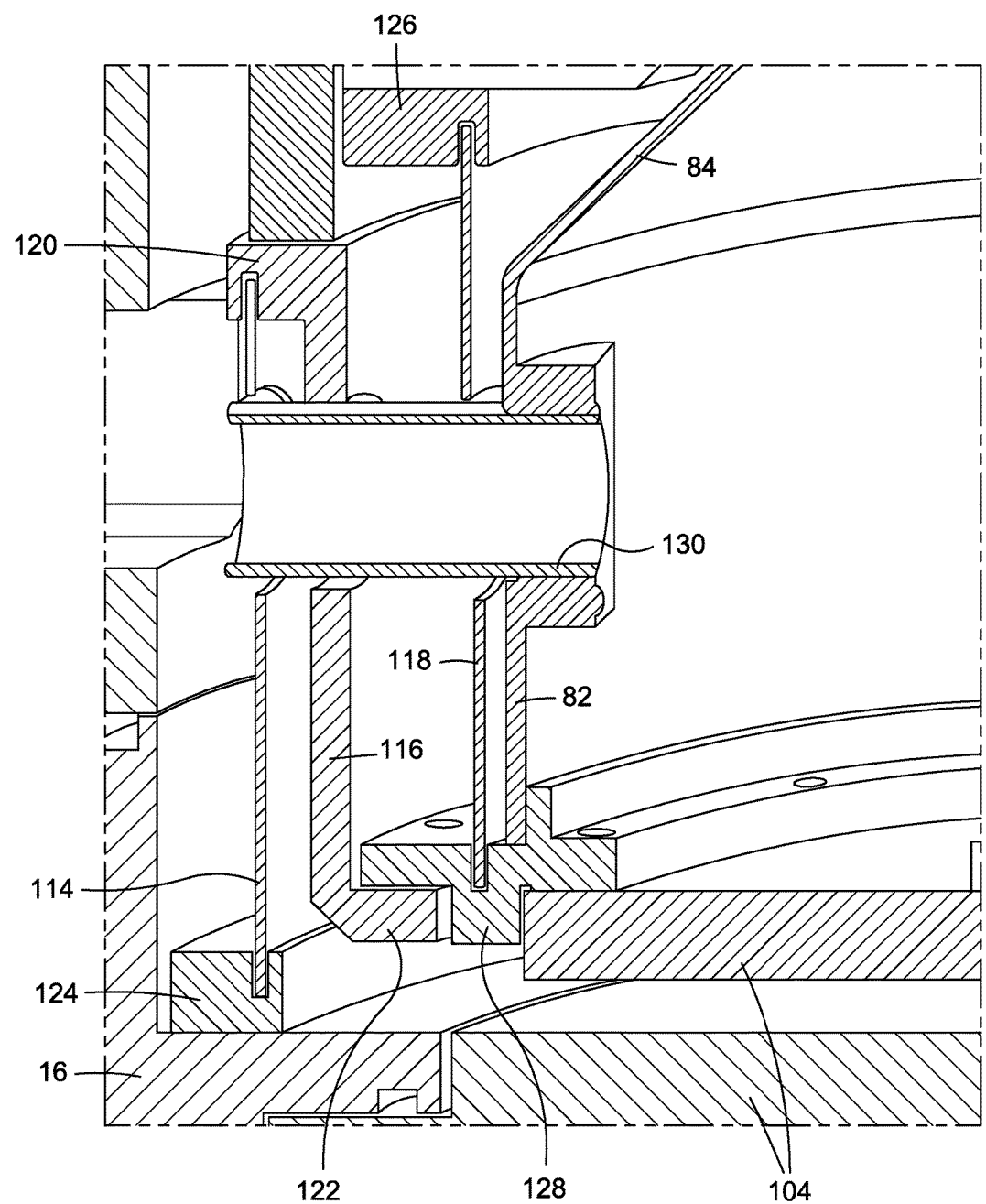
FIG. 12 is an enlarged cross sectional view taken from a second perspective of the lower region of the magnetic housing illustrating the concentric support tubes.

According to one embodiment, and referring now specifically to FIGS. 9, 11, and 12, with FIG. 9 offering a more detailed view of the cross-section shown in FIG. 6, the magnet coils 32, 34 are supported by an arrangement of concentric, nested tubes or cylinders having an intermediate temperature shield 116 in the form of a ring or cylinder disposed between support cylinders 114, 118. Intermediate temperature shield 116 extends between an upper ring 120 and a lower flange 122. Support cylinder 114 also extends between upper ring 120 and an opposing lower ring 124, while support cylinder 118 extends between magnet support ring 126 and an opposing lower support ring 128. The rings 124, 126, 128 are configured such that during operation of the cryostat apparatus 10, the temperature of the lower ring 124 may be substantially equal to room temperature, the temperature of lower support ring 128 may be in the range of 30-100K, while the temperature of the magnet support ring 126 may be substantially equal to 4K. The nested cylinders 114, 116, 118 provide strong, rigid support to the magnet coils 32, 34 which is required to operate the magnet in close proximity to the surface of an underlying optical bench. Such support strength and rigidity is needed because optical benches are typically magnetic, and thus, when the magnet (i.e., the magnet coils 32, 34) is charged to high fields, there is a large force of attraction between the table and the magnet. For instance, in some cases, the magnitude of the force of attraction may be approximately equal to one-half ton. Furthermore, the rigidity and strength provided by the nested tubes 114, 116, 118 minimizes vibrations of the cryostat components with respect to the magnet housing 30. The nested arrangement also is an efficient use of space under the magnet, which allows the magnet to be positioned closer to an underlying optical support bench.

The intermediate temperature shield 116 located between the nested support cylinders 114, 118 is operative to greatly reduce heat leak between the cryostat housing and the magnet. Furthermore, the presence of the intermediate temperature shield 116 enables the attachment of a volume defined by the lower shield 80 and intermediate shield 86 in which to place the experimental payload.

The apparatus 10 may also include one or more thermally shielded access tube(s) 130 that allows for wiring and other connections between the volume defined by lower shield 80 and the room-temperature case of the cryostat, or even the cooler side of the case of the cryostat, so as to avoid exposing the 4K magnet to radiation from either the lower shield volume and experiment payload or the room-temperature case.

It is contemplated that the cryostat apparatus 10 may be embodied as a magneto-optical property measurement device having superconducting magnet capabilities. The split coil design, as well as the unique shape of the magnet coils 32, 34 provides enhanced line of sight access to a sample residing in the viewing chamber 78. In particular, the sample may be viewed in a first direction generally parallel to the magnet axis 28, wherein the viewing angle is increased by the conical configuration of the coils 32, 34. Furthermore, the offset configuration of the magnet assembly 14 relative to the cooler 12 allows for viewing along the magnet axis 28 without the cooler 12 obstructing the view. Line of sight access to the sample may also be achieved in a plane generally perpendicular to the magnet axis 28 through any one of the seven windows 38. In this regard, the user can look through the windows 38 to obtain different circumferential perspectives of the sample. The line of sight access through the windows 38 is attainable by virtue of the spacing between the first and second annular magnet coils 32, 34.

In addition to providing the aforementioned optical advantages, the offset configuration of the magnet assembly 14 relative to the cooler 12 also mitigates vibrations within the magnet assembly 14, thereby creating an optimal environment for viewing and testing a specimen. In particular, operation of the cooler 12 typically generates vibrations, and thus, the transfer of vibrations to the magnet assembly 14 and specimen is mitigated by virtue of the magnet assembly 14 being offset from the cooler 12 and mechanically secured to the base 16.

This disclosure provides exemplary embodiments of the present disclosure. The scope of the present disclosure is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A cryostat apparatus for providing a magnetic field, the cryostat apparatus comprising:
   a cooler having a cooler chamber disposed about a cooler axis, the cooler being configured to cool a cryogenic fluid; and
   a magnet assembly in thermodynamic communication with the cooler and disposed about a magnet axis offset from the cooler axis, the magnet assembly comprising:
      a magnet housing;
      an annular first magnet coil disposed about the magnet axis within the magnet housing;
      an annular second magnet coil disposed within the magnet housing and spaced from the first magnet coil along the magnet axis; and
      a viewing chamber at least partially located between the first magnet coil and the second magnet coil, the magnet axis and at least one viewing axis perpendicular to the magnet axis both passing through the viewing chamber, the viewing axis extending between the first magnet coil and the second magnet coil;
      the first annular magnet coil including a first conical surface disposed about the magnetic axis and having a minimum periphery and a maximum periphery spaced from the minimum periphery, the minimum periphery being disposed adjacent the viewing chamber.

2. The cryostat apparatus recited in claim 1, wherein the second magnet coil includes a second conical surface disposed about the magnet axis and having a minimum periphery and a maximum periphery spaced from the minimum periphery, the minimum periphery being disposed adjacent the viewing chamber.

3. The cryostat apparatus recited in claim 2, wherein the first conical surface and the second conical surface are disposed in spaced, aligned relation to each other at opposite sides of and equidistantly from the viewing axis.

4. The cryostat apparatus recited in claim 1, wherein the magnet housing includes at least a first viewing window positioned relative to the first and second magnet coils such that the viewing axis passes through first viewing window which provides visual access into the viewing chamber.

5. The cryostat apparatus recited in claim 4, wherein the magnet housing includes a second viewing window positioned relative to the first and second magnet coils such that the magnet axis passes through the second viewing window which provides visual access into the viewing chamber.

6. The cryostat apparatus recited in claim 1, wherein the magnet housing includes a second viewing window positioned relative to the first and second magnet coils such that the magnet axis passes through the second viewing window which provides visual access into the viewing chamber.

7. The cryostat apparatus recited in claim 6, wherein the magnet housing includes an outer wall extending generally perpendicularly relative to the magnet axis, the first conical surface extending between the outer wall to the second viewing window and defining a frusto-conical recess having a minimum periphery adjacent the second viewing window and a maximum periphery adjacent the outer wall.

8. The cryostat apparatus recited in claim 1, wherein the magnet assembly includes a first thermal shield surrounding the first magnet coil and a second thermal shield surrounding the second magnet coil.

9. The cryostat apparatus recited in claim 1, further comprising a heat transfer plate extending between the magnet assembly and the cooler, the heat transfer plate being in thermodynamic communication with the magnet assembly and the cooler.

10. The cryostat apparatus recited in claim 1, wherein the first and second magnet coils are supported by an arrangement of concentric tubes having an intermediate temperature shield.

11. A magnetic cryostat apparatus comprising:
   a cooler extending along a cooler axis;
   a first magnet coil disposed about a magnet axis offset from the cooler axis, the first magnet coil having a first conical surface having a minimum periphery and a maximum periphery spaced from the minimum periphery;

a second magnet coil spaced from the first magnet coil and disposed about the magnet axis, the second magnet coil including a second conical surface disposed about the magnet axis and having a minimum periphery and a maximum periphery spaced from the minimum periphery; and a viewing chamber at least partially located between the first magnet coil and the second magnet coil and adjacent the minimum periphery of the first magnet coil and the minimum periphery of the second magnet coil, the magnet axis and a viewing axis generally perpendicular to the magnet axis both passing through the viewing chamber, the viewing axis extending between the first magnet coil and the second magnet coil, with the first conical surface and the second conical surface being disposed in spaced, aligned relation to each other at opposite sides of and equidistantly from the viewing axis.

12. The magnetic cryostat apparatus recited in claim 11, further comprising a magnet housing, the first and second coil magnets being located within the magnet housing, the magnet housing including at least a first viewing window positioned relative to the first and second magnet coils such that the viewing axis passes through first viewing window which provides visual access into the viewing chamber.

13. The magnetic cryostat apparatus recited in claim 12, wherein the magnet housing includes a second viewing window positioned relative to the first and second magnet coils such that the magnet axis passes through the second viewing window which provides visual access into the viewing chamber.

14. The magnetic cryostat apparatus recited in claim 12, wherein the magnet housing includes an outer wall extending generally perpendicular to the magnet axis, the first conical surface extending between the outer wall to the second viewing window and defining a frusto-conical recess having a minimum periphery adjacent the second viewing window and a maximum periphery adjacent the outer wall.

15. The magnetic cryostat apparatus recited in claim 12, further comprising a first thermal shield surrounding the first magnet coil and a second thermal shield surrounding the second magnet coil.

16. The magnetic cryostat apparatus recited in claim 11, further comprising a heat transfer plate extending between the magnet assembly and the cooler, the heat transfer plate being in thermodynamic communication with the magnet assembly and the cooler.

17. The magnetic cryostat apparatus recited in claim 11, wherein the first and second magnet coils are supported by an arrangement of concentric tubes having an intermediate temperature shield.

18. A cryostat apparatus for providing a magnetic field with enhanced optical access, the cryostat apparatus comprising:
a split-coil superconducting magnet comprising two coils disposed about a magnetic axis and a center field region disposed between the two coils, at least one of the two coils having an inward facing cone shape;
a split region between the two coils providing line of sight access between the center field region and a region radially outside of the split-coil superconducting magnet;
a vacuum housing around the split-coil superconducting magnet;

at least one optically transparent first window in the vacuum housing allowing line of sight access along the magnet axis;
at least one optically transparent second window in the vacuum housing allowing line of sight access radially between said center field region and a region outside the cryostat through the split in the magnet; and
a cooler extending along a cooler axis offset from the magnet axis.

19. A magnetic cryostat apparatus comprising:
a cooler extending along a cooler axis;
a first magnet coil disposed about a magnet axis offset from the cooler axis, the first magnet coil having a first conical surface having a minimum periphery and a maximum periphery spaced from the minimum periphery;
a second magnet coil spaced from the first magnet coil and disposed about the magnet axis;
a viewing chamber at least partially located between the first magnet coil and the second magnet coil and adjacent the minimum periphery of the first magnet coil, the magnet axis and a viewing axis generally perpendicular to the magnet axis both passing through the viewing chamber, the viewing axis extending between the first magnet coil and the second magnet coil; and
a magnet housing, the first and second coil magnets being located within the magnet housing, the magnet housing including at least a first viewing window positioned relative to the first and second magnet coils such that the viewing axis passes through first viewing window which provides visual access into the viewing chamber, and a second viewing window positioned relative to the first and second magnet coils such that the magnet axis passes through the second viewing window which also provides visual access into the viewing chamber.

20. A magnetic cryostat apparatus comprising:
a cooler extending along a cooler axis;
a first magnet coil disposed about a magnet axis offset from the cooler axis, the first magnet coil having a first conical surface having a minimum periphery and a maximum periphery spaced from the minimum periphery;
a second magnet coil spaced from the first magnet coil and disposed about the magnet axis;
a viewing chamber at least partially located between the first magnet coil and the second magnet coil and adjacent the minimum periphery of the first magnet coil, the magnet axis and a viewing axis generally perpendicular to the magnet axis both passing through the viewing chamber, the viewing axis extending between the first magnet coil and the second magnet coil; and
a magnet housing, the first and second coil magnets being located within the magnet housing, the magnet housing including at least a first viewing window positioned relative to the first and second magnet coils such that the viewing axis passes through first viewing window which provides visual access into the viewing chamber, the magnet housing further including an outer wall extending generally perpendicular to the magnet axis, the first conical surface extending between the outer wall to the second viewing window and defining a frusto-conical recess having a minimum periphery adjacent the second viewing window and a maximum periphery adjacent the outer wall.

21. A magnetic cryostat apparatus comprising:
a cooler extending along a cooler axis;
a first magnet coil disposed about a magnet axis offset from the cooler axis, the first magnet coil having a first conical surface having a minimum periphery and a maximum periphery spaced from the minimum periphery;
a second magnet coil spaced from the first magnet coil and disposed about the magnet axis;
a viewing chamber at least partially located between the first magnet coil and the second magnet coil and adjacent the minimum periphery of the first magnet coil, the magnet axis and a viewing axis generally perpendicular to the magnet axis both passing through the viewing chamber, the viewing axis extending between the first magnet coil and the second magnet coil;
a magnet housing, the first and second coil magnets being located within the magnet housing, the magnet housing including at least a first viewing window positioned relative to the first and second magnet coils such that the viewing axis passes through first viewing window which provides visual access into the viewing chamber; and
a first thermal shield surrounding the first magnet coil and a second thermal shield surrounding the second magnet coil.

* * * * *